US006926803B2

(12) United States Patent
Antolik (10) Patent No.: US 6,926,803 B2
(45) Date of Patent: Aug. 9, 2005

(54) CONFINEMENT RING SUPPORT ASSEMBLY (75) Inventor: Jerrel K. Antolik, Livermore, CA (US)

(73) Assignee: Lam Research Corporation, Fremont, CA (US)

( * ) Notice: Subject to any disclaimer, the term of this patent is extended or adjusted under 35 U.S.C. 154(b) by 285 days.

(21) Appl. No.: 10/418,245

(22) Filed: Apr. 16, 2003

(65) Prior Publication Data

US 2003/0196755 A1 Oct. 23, 2003

Related U.S. Application Data (60) Provisional application No. 60/373,491, filed on Apr. 17, 2002.

(51) Int. Cl.[7] .......................... H01L 21/00; C23C 16/00
(52) U.S. Cl. ............. 156/915; 156/345.53; 156/345.51; 156/345.52; 118/715; 118/723 R; 118/500; 204/192.1; 204/298.1; 216/67; 438/710; 315/111.71; 427/534; 427/569
(58) Field of Search ........................... 156/915, 345.53, 156/345.51; 118/715–733, 500; 204/192.1, 298.1; 216/67; 438/710; 427/534, 569; 315/111.71; 206/821; 74/142

(56) References Cited

U.S. PATENT DOCUMENTS

| 5,534,751 | A | * | 7/1996 | Lenz et al. ............. 315/111.71 |
| 5,998,932 | A | * | 12/1999 | Lenz ....................... 315/111.21 |
| 6,019,060 | A | * | 2/2000 | Lenz ....................... 118/723 R |
| 6,178,919 | B1 | * | 1/2001 | Li et al. ................... 118/723 E |
| 6,350,317 | B1 | * | 2/2002 | Hao et al. .................... 118/71 |
| 6,416,084 | B1 | * | 7/2002 | Mantyla ....................... 285/56 |
| 6,492,774 | B1 | * | 12/2002 | Han et al. ............... 315/111.21 |
| 6,527,911 | B1 | * | 3/2003 | Yen et al. ............... 156/345.43 |
| 6,602,381 | B1 | * | 8/2003 | Lenz ......................... 156/345.1 |
| 6,744,212 | B2 | * | 6/2004 | Fischer et al. .......... 315/111.21 |
| 2002/0121500 | A1 | * | 9/2002 | Annapragada et al. ........ 216/67 |
| 2003/0029567 | A1 | * | 2/2003 | Dhindsa et al. ......... 156/345.47 |

* cited by examiner

Primary Examiner—P. Hassanzadel
Assistant Examiner—Ram N Kackar
(74) Attorney, Agent, or Firm—IP Strategy Group, P.C.

(57) ABSTRACT

A confinement ring support assembly for coupling together a plurality of confinement rings in a plasma processing chamber. The confinement ring support assembly includes a post having first end and a second end. The post further includes a first lip having an associated first sliding surface, and a second lip having an associated second sliding surface. The first lip is disposed at a first position on the post, the second lip being disposed at a second position at a different arc relative to the first location on the post, the second position being disposed between the first position and the first end along a longitudinal axis of the post. The confinement ring support assembly further includes a first washer configured to move slidably from the first lip past the second lip toward the first end of the post. The first washer has a first cut formed in its interior opening that is configured to engage with the first lip to prevent the first washer from sliding past the first lip in a direction away from the first end and to engage with the first sliding surface associated with the first lip to constrain a rotational movement of the first washer as the washer moves longitudinally along the post.

29 Claims, 7 Drawing Sheets

CONFINEMENT RING SUPPORT ASSEMBLY

The present invention claims priority from a commonly assigned U.S. Provisional Application Ser. No. 60/373,491, filed Apr. 17, 2002 entitled "WAP Ring Assembly Hanger Apparatus" and a commonly assigned U.S. patent application Ser. No. 09/916,784, filed Jul. 27, 2001 entitled "Twist-N-Lock Wafer Area Pressure Ring and Assembly", and a commonly assigned U.S. Provisional Application Ser. No. 60/281,049, filed Apr. 2, 2001 entitled "Twist-N-Lock Wafer Area Pressure Ring and Assembly" all of which are by inventor Jerrel K. Antolik and are incorporated by reference herein.

BACKGROUND OF THE INVENTION

The present invention relates to methods and apparatus for controlling the pressure around and above a substrate. More particularly, the present invention relates to improved wafer area pressure control rings.

In the fabrication of semiconductor-based devices (e.g., integrated circuits), layers of material may alternately be deposited onto and etched from a substrate (e.g., the semiconductor wafer). As is well known in the art, the etching of the deposited layers may be accomplished by a variety of techniques, including plasma-enhanced etching. In plasma-enhanced etching, the actual etching of the substrate takes place inside a plasma processing chamber. During etching, a plasma is formed from a suitable etchant source gas to etch areas of the substrate that are unprotected by the mask, leaving behind the desired pattern.

Among different types of plasma etching systems, those utilizing confinement rings have proven to be highly suitable for the efficient production of and/or for forming the ever shrinking features on the substrate. An example of such a system may be found in the commonly assigned U.S. Pat. No. 5,534,751, which is incorporated by reference herein. Although the use of confinement rings results in a significant improvement in the performance of plasma processing systems, current implementations can be improved. In particular, it is realized that improvements can be made in the way in which confinement rings are maintained and replaced. More particularly, significant improvements can be made in the way in which these rings are attached within the chamber.

Generally speaking, the confinement ring assembly includes a plurality of confinement rings, with the uppermost ring being the thickest and functioning as the attachment structure for attaching the confinement ring assembly to the a plunger. In the exemplary Exelan 2300 ™ plasma etching system, which is available from Lam Research Corporation of Fremont, Calif., the movement of the plunger moves the confinement ring assembly into position for processing or away from the plasma generating region to facilitate substrate insertion and removal. For example, as the plunger moves upward, the confinement ring assembly, including the uppermost ring and other rings of the assembly, moves upward to facilitate substrate insertion and removal. As the plunger assembly moves downward, the confinement rings of the assembly are positioned in place to facilitate processing.

In the past, a staircase hanger has been employed to couple the confinement rings of the confinement ring assembly together. With the confinement rings of the assembly coupled together via the staircase hanger, the entire assembly can then be coupled to the plunger by coupling the uppermost ring of the confinement ring assembly with the plunger. The aforementioned U.S. patent application Ser. No. 09/916,784 describes a twist-n-lock arrangement for coupling the confinement ring assembly with the plunger.

Figure 1A:
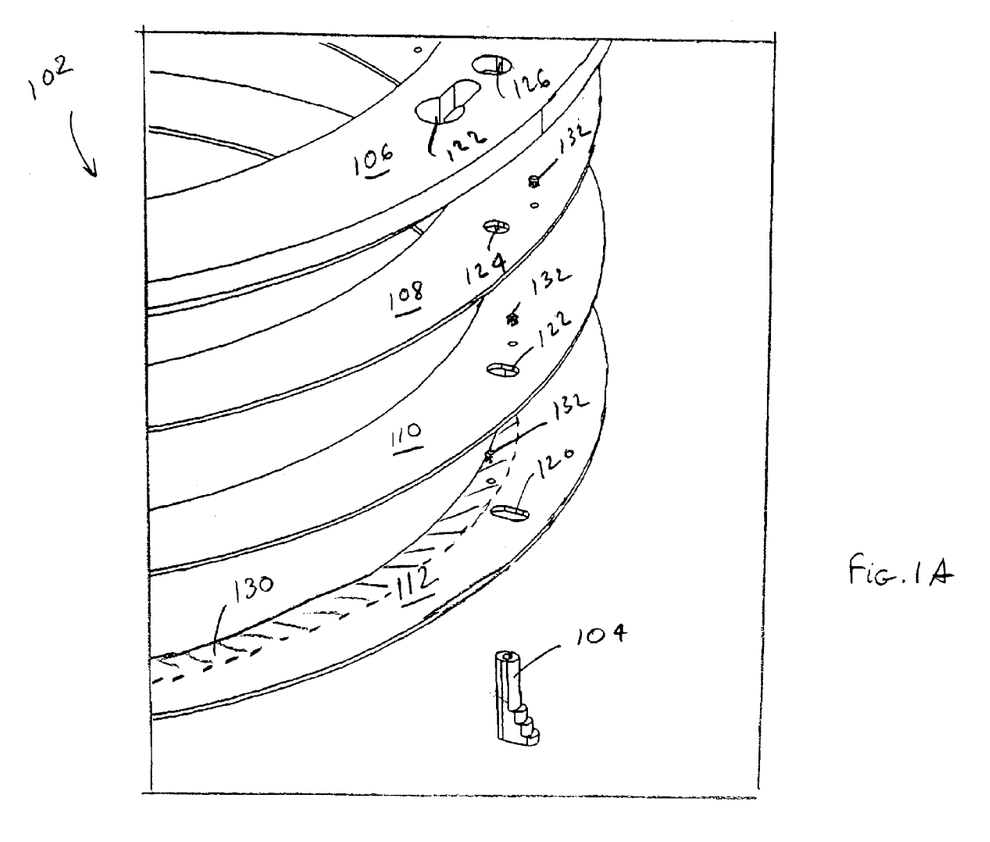
FIG. 1A shows an exploded view of confinement ring assembly, including staircase hanger and a plurality of confinement rings.

To facilitate discussion, FIG. 1A shows an exploded view of confinement ring assembly 102, including staircase hanger 104 and rings 106, 108, 110, and 112. Staircase hanger 104 is shown in greater detail in FIG. 1B. To simplify the illustration, only one staircase hanger and its associated hanger holes in the rings are shown. It should be noted that the confinement ring assembly typically includes a plurality of hangers and associated hanger holes (e.g., generally three sets of hangers and associated hanger holes) to provide adequate support for the confinement ring assembly.

Staircase hanger 104 includes a plurality of steps 154, 156, 158, and 160 for supporting respective rings 106, 108, 110, and 112. Each of rings 106, 108, 110, and 112 has an associated hanger hole to accommodate hanger 104. As shown in FIG. 1A, ring 112 has a hanger hole 120, ring 110 has a hanger hole 122, ring 108 has a hanger hole 124, and ring 106 has a hanger hole 126. The upper end of staircase hanger is coupled with top confinement ring 106 and hanger hole 126 via an appropriate fastening arrangement, such as a screw.

In the example of FIG. 1A, the hanger holes 120, 124, 126, and 128 have different sizes to facilitate the stowage and deployment of the confinement ring assembly. To stow the confinement ring assembly (e.g., during substrate insertion and removal), top confinement ring 106 are pulled upward by the upward movement of a plunger (not shown in FIG. 1A), which is connected to top confinement ring 106 via a keyhole 122. The hanger holes are dimensioned such that when the confinement rings are stowed, ring 112 rests on step 160 (see FIG. 1B), ring 110 rests on step 158, ring 108 rests on step 156, and ring 106 rests on step 154. As such, the entire assembly is moved upward and out of the path of substrate insertion and removal.

To deploy the confinement rings, the plunger is moved downward, which causes top confinement ring 106 and other confinement rings to move downward. When bottom confinement ring 112 makes contact with the lower electrode or another structure disposed below lower confinement ring 112, the movement of lower confinement ring is arrested. For example, the lower electrode may be disposed under lower confinement ring 112 and may make contact with an area 130 of the lower surface of lower confinement ring 112 as the entire confinement ring assembly moves downward. Even though the downward movement of lower confinement ring 112 is stopped, other rings of the confinement ring assembly, such as ring 110, 108, and 106 continue to move downward until their movement is arrested by lower confinement ring 112. As such, the rings collapse upon one another. A spacer button 132, which is disposed on the upper surface of each of confinement rings 112, 110, and 108 ensure that the rings are separated from one another by a predefined distance during processing.

Figure 1B:
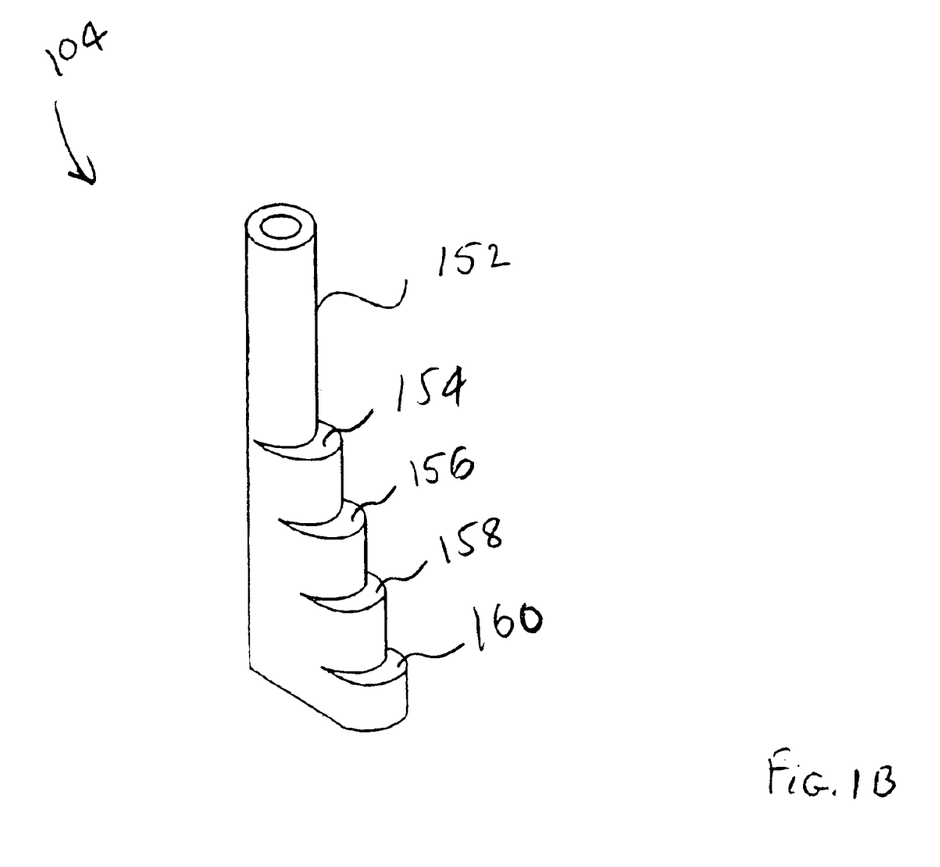
FIG. 1B shows a staircase hanger.

Although the staircase hanger arrangement of FIG. 1A and FIG. 1B facilitate the deployment and stowage of the confinement ring assembly, improvements are possible. It has been noted that the use of staircase hanger 104 requires that hanger holes having different dimensions be provided in the confinement rings. With respect to FIG. 1A, for example, hanger holes 120, 122, and 124 need to have different sizes to facilitate the stowage and deployment of the confinement rings in the manner described above. This requirement means that confinement rings 112, 110, and 108 are different parts, requiring the manufacturer and/or users of the plasma processing system to stock different confinement rings for maintenance and repair. Furthermore, spacer buttons 132 must also be stocked. Additionally, some users report that the small size of spacer buttons 132 present difficulties during confinement ring maintenance in that it is easy to lose the small spacer button, or worse, to drop the spacer button in difficult-to-reach recesses within the plasma processing chamber.

SUMMARY OF THE INVENTION

The invention relates, in one embodiment, to a confinement ring support assembly for coupling together confinement rings in a plasma processing chamber. The confinement ring support assembly includes a post having a first end and a second end. The post has a plurality of supporting lips and a plurality of corresponding sliding surfaces. Each of the plurality of supporting lips is offset from one another longitudinally and is disposed at a different arc relative to one another. Each of the plurality of supporting lips is associated with a corresponding one of the plurality of sliding surfaces. Each of the plurality of sliding surfaces extends longitudinally from its corresponding lip toward the second end. The confinement ring support assembly further includes a plurality of washers. Each of the plurality of washers has an interior opening to permit the each of the plurality of washers to slide longitudinally along the post. The interior opening has a cut that mates with one of the sliding surfaces to constrain a rotational movement of the each of the plurality of washers when the each of the plurality of washers slides along its corresponding sliding surface in a longitudinal direction relative to the post. Each of the plurality of washers is constrained in its longitudinal movement toward the first end by a supporting lip associated with a sliding surface that mates with its interior opening cut. At least one the plurality of washers is configured to slide freely past a supporting lip associated with another one of the plurality of washers in its longitudinal direction toward the second end.

In another embodiment, the invention relates to a confinement ring support assembly for coupling together a plurality of confinement rings. The confinement rings are configured for use in a plasma processing chamber. The confinement ring support assembly includes a post having first end and a second end. The post further has a first lip and a second lip. The first lip is disposed at a first position on the post, the second lip being disposed at a second position at a different arc relative to the first location on the post, the second position being disposed between the first position and the first end along a longitudinal axis of the post. The confinement ring support assembly further includes a first washer configured to move slidably from the first lip past the second lip toward the first end of the post. The first washer has a first cut formed in its interior opening. The first cut is configured to engage with the first lip to prevent the first washer from sliding past the first lip in a direction away from the first end. The confinement ring support assembly further includes a second washer configured to move slidably from the second lip toward the first end of the post. The second washer has a second cut formed in its interior opening, the second cut is configured to engage with the second lip to prevent the second washer from sliding past the second lip in the direction away from the first end.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

To facilitate discussion.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention. The features and advantages of the present invention may be better understood with reference to the drawings and discussions that follow.

In accordance with one aspect of the present invention, there is provided a confinement ring support assembly for coupling together confinement rings. The confinement ring support assembly herein does not require different rings of the confinement ring assembly to have holes of different sizes. The confinement ring support assembly includes a post having a plurality of supporting lips that are disposed at different arcs relative to one another around the post. Each supporting lip has an associated sliding surface extending longitudinally from the supporting lip toward one of the ends of the post.

Washers having cut disposed in their interior openings may then slide along the post. When a washer is oriented such that its cut slides along a sliding surface, the movement of that washer is constrained at one extreme by the supporting lip associated with that sliding surface. By spacing the supporting lips longitudinally apart from one another and at different arcs with respect to one another around the post, the plurality of washers can slide along the post with each washer being constrained by its respective supporting lip.

The washers may then be used to support the confinement rings, thereby allowing individual confinement rings coupled via the confinement ring support assembly to slide along the post. Since the job of constraining the movement of a confinement ring is provided by its associated washer, all confinement rings may have identical through holes. Furthermore, since two adjacent confinement rings cannot come closer to one another than the thickness of the washer disposed in between, the thickness of the washer may be sized appropriately to ensure that an appropriate spacing between adjacent confinement rings exists when the confinement rings are deployed during processing.

Figure 2A:
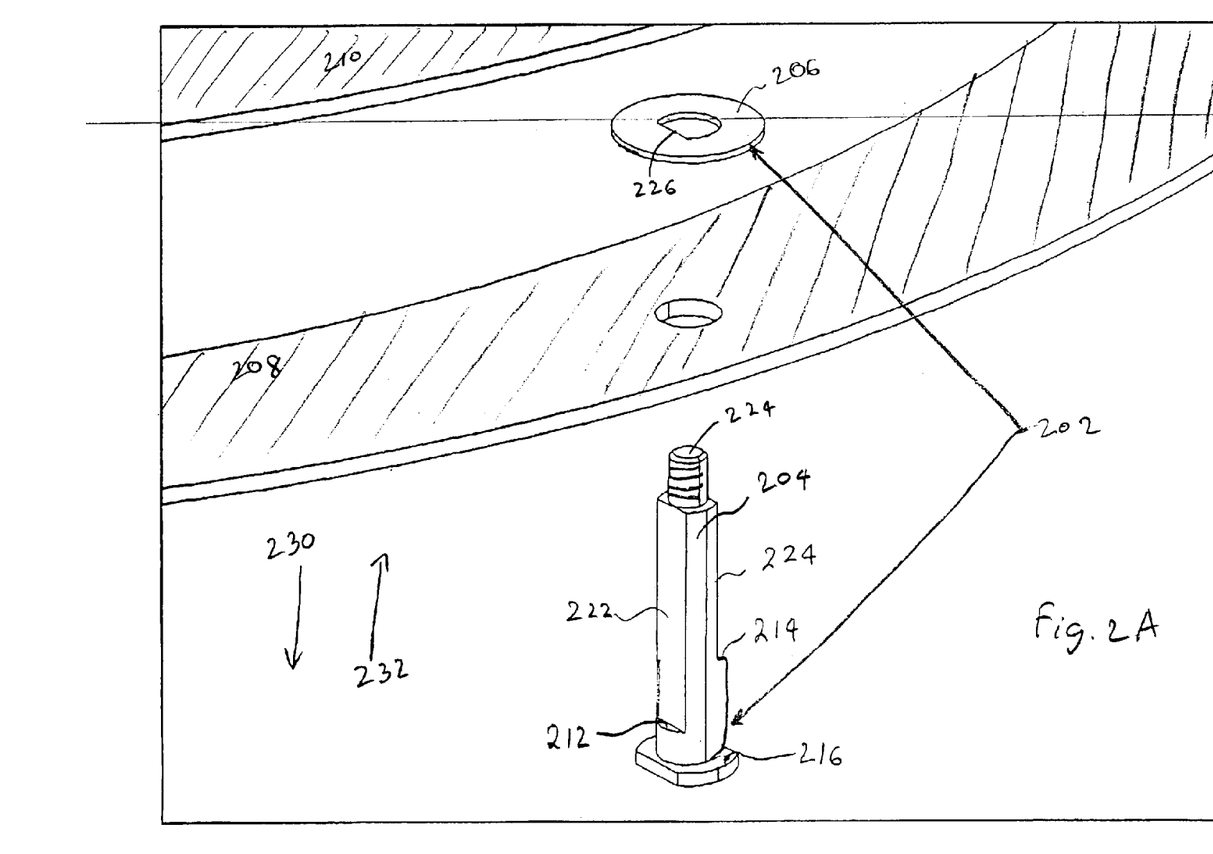
FIG. 2A shows, in accordance with one embodiment of the present invention, a confinement ring support assembly, including a post and a washer.

The features and advantages of the invention may be better understood with reference to the figures and discussions that follow. FIG. 2A shows, in accordance with one embodiment of the present invention, a confinement ring support assembly 202 including a post 204 and a washer 206. Post 204 and washer 206 may be made of any suitable material that is substantially resistant to the plasma etching environment and is preferably (but not absolutely required in all cases) nonconductive. In one embodiment, post 204 and washer 206 are made of a suitable plastic, such as virgin polyetheretherketone (PEEK).

To facilitate discussion, confinement ring 208 and 210 are also shown. Post 204 includes a base 216 and a plurality of supporting lips 212 and 214. To simplify the discussion, there are only two lips in FIG. 2A although more lips may be provided for a given post.

Lip 212 and lip 214 are disposed at different positions along the longitudinal axis of post 204. Further, lip 212 and lip 214 are disposed at different arcs relative to one another. In the example of FIG. 2A, lip 212 and lip 214 are 180 degrees apart. Lip 212 has an associated sliding surface 222 extending longitudinally from lip 212 toward an end 224 of post 204. Likewise, lip 214 has an associated sliding surface 224 extending longitudinally from lip 214 toward an end 224 of post 204.

Washer 206 has a cut 226 within its interior opening 228. Cut 226 is configured to slide along sliding surface 222 when ring 208 and washer 206 move in the direction of arrow 230. The movement of washer 206 in the direction of arrow 230 is constrained by lip 212 since cut 226 is designed to engage lip 212 to prevent washer 206 from sliding past lip 212 in the direction of arrow 230.

Lip 214 and sliding surface 224 are also designed such than another washer similar to washer 206 but not rotated so that its cut mates with sliding surface 224 can slide along post 204 in the direction of arrow 230. In this case, the movement of this rotated washer will be constrained by lip 214 when its cut engages lip 214, thus preventing this rotated washer from sliding past lip 214 in the direction of arrow 230. For ease of illustration, this rotated washer is not shown in FIG. 2A.

Note that post 204 and its associated lips and sliding surfaces are configured such that washer 206 can freely slide past lip 214 in either direction of arrow 230 or direction of arrow 232. In one preferred embodiment as shown in FIG. 2A, the sliding surfaces of the post are flat, and the corresponding cuts in the washers are created such that the interior opening of each washer resembles the capital letter "D". However, as long as sliding surface 222 can engage a corresponding cut in the washer to constrain the angular movement of the washer as well as the longitudinal movement of the washer as the washer slides along post 204, sliding surface 222 and the corresponding cut in the washer can take any desired shape or form.

Figure 2B:
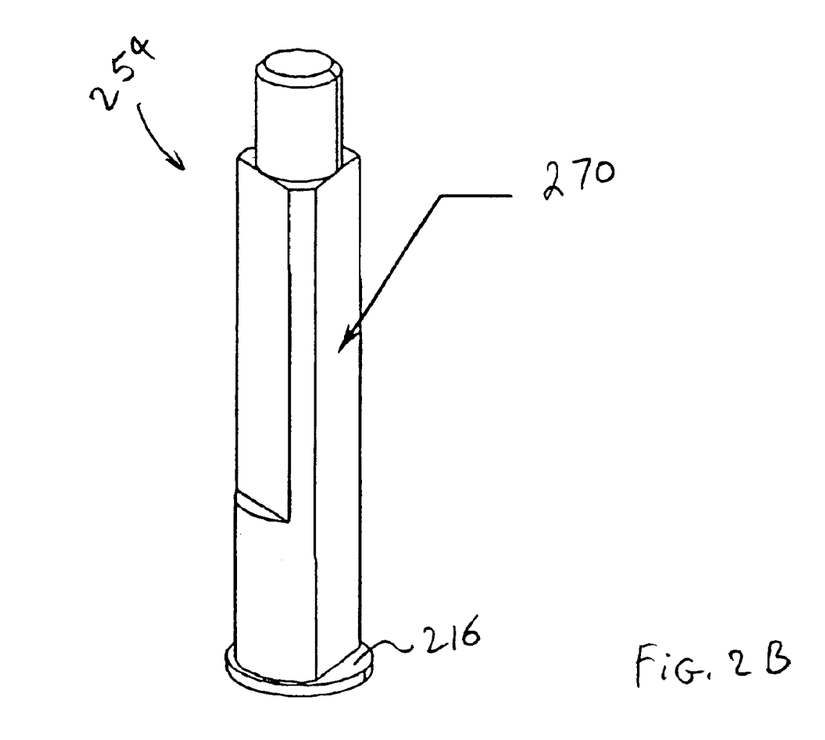
FIG. 2B shows, in another embodiment, a post having a sliding surface that extends to the base of the post.

FIG. 2B shows, in another embodiment, a post 254 having a sliding surface 270 that extends to base 216.

Figure 3:
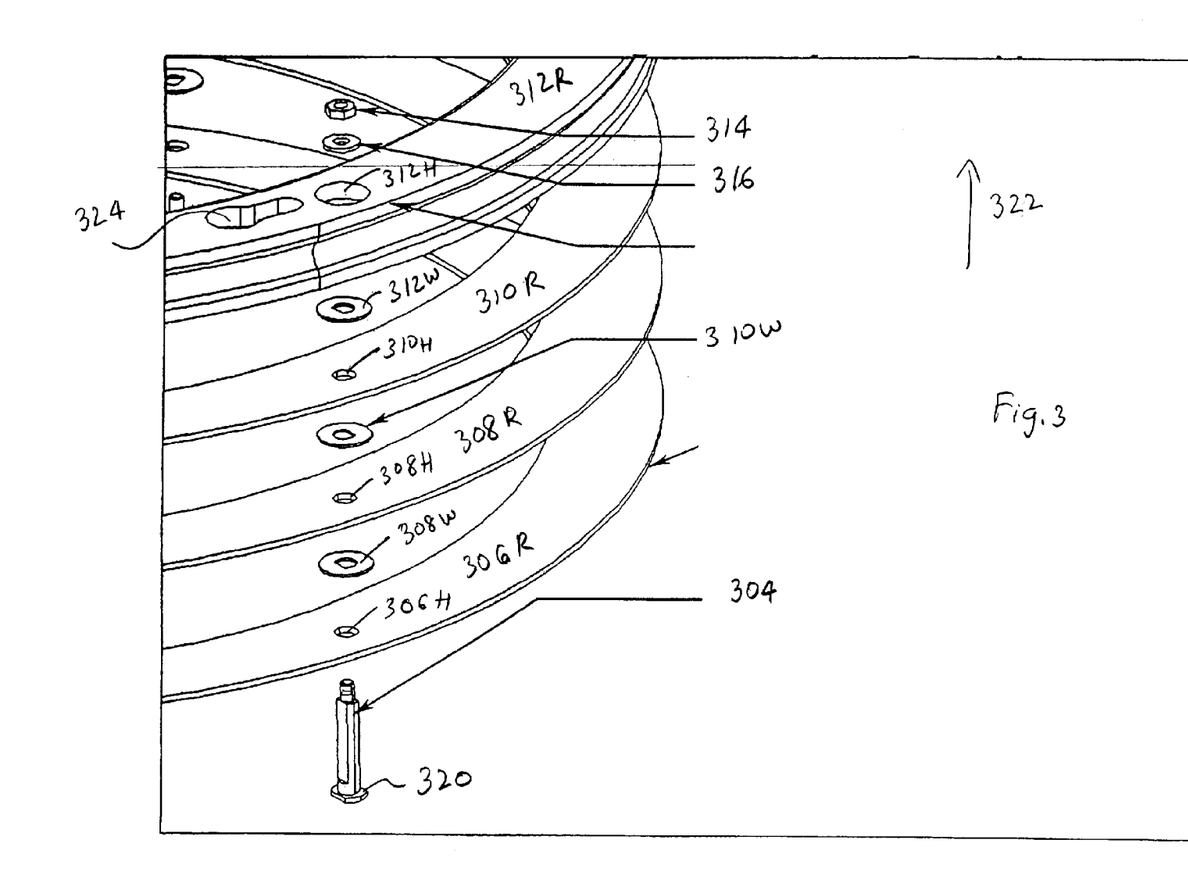
FIG. 3 shows, in accordance with one embodiment of the present invention, a confinement ring support assembly that includes a post having three supporting lips and three corresponding sliding surfaces.

One skilled in the art would readily appreciate that any number of lips and sliding surfaces may be provided. In the example of FIG. 3, there is shown a confinement ring support assembly that includes a post 304 having three supporting lips and three corresponding sliding surfaces. In this example, the supporting lips are disposed 120 degrees from one another although, as mentioned, it is not absolutely required that the lips must be disposed at equal angles relative to one another. Post 304 is threaded through the through holes 306H, 308H, 310H, and 312H of respective rings 306R, 308R, 310R, and 312R. In the example of FIG. 3, hole 312H in top ring 312R is counter-sunk to accept a nut 314 and a conventional washer 316, which are employed to fasten post 306 to top ring 312R. However, this counter-sunk feature is not a requirement, nor is the use of a nut and a conventional washer as the method for fastening post 304 to top ring 312R.

Lower ring 306R is designed to rest on base 320 of post 304 during confinement ring stowage, i.e., when the upper confinement ring 312R is moved upward in the direction of arrow 322 by the movement of a plunger that engages in keyhole 324. In another embodiment, however, lower ring 306R may be designed to rest on a lip, such as one similar to lip 212, if desired. Furthermore, although upper confinement ring 312R is attached to the plunger via a key hole arrangement in a twist-n-lock manner (as described in the aforementioned U.S. patent application Ser. No. 09/916, 784), the present invention does not absolutely require such an attachment mechanism. Other attachment arrangements to attach upper confinement ring 312R to the plunger may also be employed with the confinement ring support assembly of the present invention.

The next confinement ring 308R is designed to rest on washer 308W during confinement ring stowage. Likewise, confinement ring 310R is designed to rest on washer 310W during confinement ring stowage. Confinement ring 312R itself is attached to the plunger and thus needs no support from a washer during confinement ring stowage. Since the longitudinal movement of each washer is constrained by its respective lip in post 304, the washers are positioned in a spaced-apart relationship relative to one another during confinement ring stowage.

Figure 4:
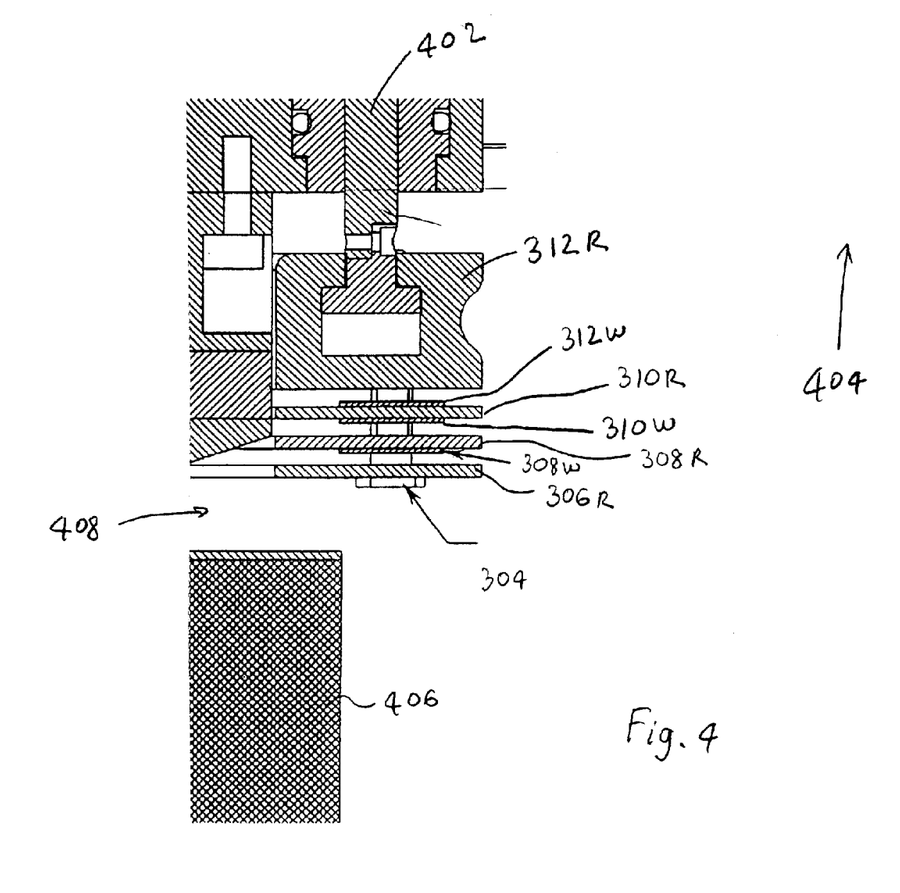
FIG. 4 shows the operation of the confinement ring support assembly during confinement ring stowage.

FIG. 4 shows rings 306R, 308R, 310R, and 312R during confinement ring stowage. In FIG. 4, plunger 402 and attached upper ring 312R have moved in the direction of arrow 404, causing ring 310R to rest on washer 310W, which is engaged by a lip on post 304. Likewise, ring 308R rests on washer 308W, which is engaged by another lip on post 304. Bottom ring 306R is shown resting on the base of post 304. Note that in the confinement ring stowage position, the confinement rings are moved away from a lower electrode 406 and out of the path of a passage 408, which is employed to insert substrates into the chamber for processing or remove substrates therefrom.

Figure 5:
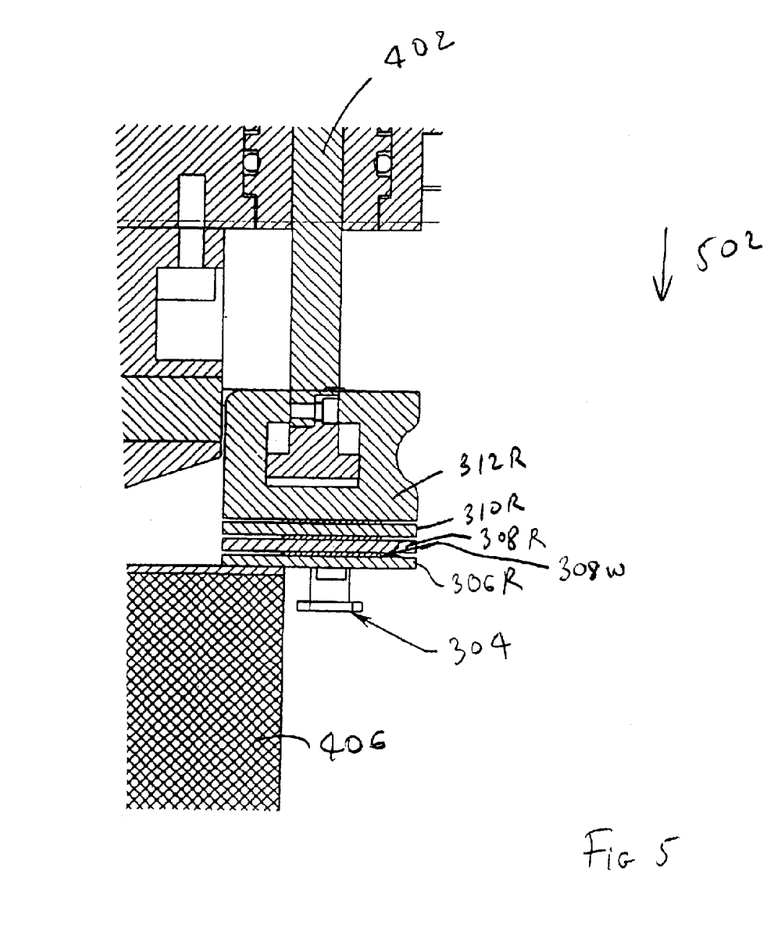
FIG. 5 shows the operation of the confinement ring support assembly during confinement ring deployment.

When the confinement rings are deployed, plunger 402 moves downward in the direction of arrow 502, as shown in FIG. 5. At some point, lower ring 306R is caught by lower electrode 406, preventing lower ring 306R from moving further in the direction of arrow 502. The rings collapse together as upper ring 312R continues to be moved downward along in the direction of arrow 502 by its attached plunger.

With reference to FIG. 3, rings 306R, 308R, and 310R, as well as washers 308W, 310W, are 312W are configured to slide freely along post 304 in direction 322 until the rings and washers make contact with one another as shown in FIG. 5. To clarify, washer 308W is not constrained by the lip that constrains washer 310W in its movement upward in the direction of arrow 322, nor is washer 310W constrained by the lip that arrests the movement of washer 312W in its movement upward in the direction of arrow 322. In the deployed position, adjacent rings are held apart from one another by the thickness of the washer disposed in between (such as washer 308W shown between rings 306R and 308R in FIG. 5). Accordingly there is no need for spacer buttons, such as spacer buttons 132 of FIG. 2A. The washers in this case provide the function of supporting the rings during the confinement ring stowage operation and keeping the rings properly spaced apart during confinement ring deployment.

Note that since the washers provide the function of engaging with appropriate lips during the confinement ring stowage phase, this function is no longer required of the confinement rings themselves. Accordingly, holes 306H, 308H, and 310H in rings 306R, 308R, and 310R may be made identical. In fact, rings 306R, 308R, and 310R may be identical parts since there is no longer a need to create through holes of different sizes in different rings of the confinement ring assembly. Of course top ring 312R is a different ring, but such is necessary since top ring 312R is the ring that is attached to the plunger for the purpose of moving the entire confinement ring assembly into and out of position from run to run.

As can be appreciated from the foregoing, the inventive confinement ring support assembly obviates the need for separate spacer buttons. Furthermore, the inventive confinement ring support assembly obviates the need for different hole sizes in different confinement rings of the confinement ring assembly. As such, there is no need to produce and stock a large number of different rings. These features advantageously reduce the cost of producing and maintaining the confinement ring assembly, leading to a lower cost of owner ship for users While this invention has been described in terms of several preferred embodiments, there are alterations, permutations, and equivalents which fall within the scope of this invention. It should also be noted that there are many alternative ways of implementing the apparatuses of the present invention. It is therefore intended that the following appended claims be interpreted as including all such alterations, permutations, and equivalents as fall within the true spirit and scope of the present invention.

What is claimed is:

1. A confinement ring support assembly for coupling together confinement rings in a plasma processing chamber, comprising:
   a post having a first end and a second end, said post having a plurality of supporting lips and a plurality of corresponding sliding surfaces, each of said plurality of supporting lips being offset from one another longitudinally and being disposed at a different arc relative to one another, each of said plurality of supporting lips being associated with a corresponding one of said plurality of sliding surfaces, said each of said plurality of sliding surfaces extending longitudinally from its corresponding lip toward said second end; and
   a plurality of washers, each of said plurality of washers having an interior opening to permit said each of said plurality of washers to slide longitudinally along said post, said interior opening having a cut that mates with one of said sliding surfaces to constrain a rotational movement of said each of said plurality of washers when said each of said plurality of washers slides along its corresponding sliding surface in a longitudinal direction relative to said post, said each of said plurality of washers being constrained in its longitudinal movement toward said first end by a supporting lip associated with a sliding surface that mates with its interior opening cut, at least one said plurality of washers being configured to slide freely past a supporting lip associated with another one of said plurality of washers in its longitudinal direction toward said second end.

2. The confinement ring support assembly of claim 1 wherein at least one of said plurality of washers has a D-shape interior opening.

3. The confinement ring support assembly of claim 1 wherein said plurality of washers are substantially identical, each of said plurality of washers having a D-shape interior opening with a flat cut of said D-shape interior opening being configured to mate with one of said plurality of sliding surfaces.

4. The confinement ring support assembly of claim 3 wherein each of said plurality of D-washers is configured to rest on its corresponding supporting lip to support a different one of said confinement rings when said confinement rings are in a stowed position, each of said confinement rings having a hole disposed through said each of said confinement rings to accommodate said post and to allow said each of said confinement rings to slide longitudinally along said post.

5. The confinement ring support assembly of claim 4 wherein said confinement rings are configured to be disposed closer to one another in a deployed position than in said stowed position, adjacent ones of said confinement rings being separated from one another by one of said plurality of washers in said deployed position, said deployed position representing a situation wherein said confinement rings are in place to facilitate processing of a substrate in said plasma processing chamber.

6. The confinement ring support assembly of claim 5 wherein said confinement rings are stowed by moving a first confinement ring of said confinement rings in a first direction, said first direction being parallel to a direction from said first end to said second end of said post when said confinement ring support assembly is installed in said plasma processing chamber, said first confinement ring representing a confinement ring positioned closest to said second end of said post.

7. The confinement ring support assembly of claim 6 wherein said confinement rings are deployed by moving said first confinement ring of said confinement rings in a second direction, said second direction being parallel to a direction from said second end to said first end of said post when said confinement ring support assembly is installed in said plasma processing chamber, said confinement rings being pushed closer to one another in said deployed position relative to said stowed position due to an arrest in movement of a second confinement ring of said confinement rings by another structure, said second confinement ring representing a confinement ring positioned closest to said first end of said post, said arrest in movement of said second confinement ring preventing said second confinement ring from moving in said second direction a lower electrode even as other confinement rings of said confinement rings continue to move in said second direction.

8. The confinement ring support assembly of claim 7 wherein said second end of said post is attached to said first confinement ring.

9. The confinement ring support assembly of claim 7 wherein said another support structure represents a lower electrode in said plasma processing chamber.

10. The confinement ring support assembly of claim 7 wherein holes disposed in said confinement rings to accommodate said post are substantially identical in shape and size.

11. The confinement ring support assembly of claim 1 wherein said post is formed of a material that is substantially non-conductive electrically.

12. A confinement ring assembly for use in a plasma processing chamber, comprising:

a plurality of confinement rings; and a confinement ring support assembly for coupling together said plurality of confinement rings, said confinement ring support assembly including a) a post having a first end and a second end, said post having a plurality of supporting lips and a plurality of corresponding sliding surfaces, each of said plurality of supporting lips being offset from one another longitudinally and being disposed at a different arc relative to one another, each of said plurality of supporting lips being associated with a corresponding one of said plurality of sliding surfaces, said each of said plurality of sliding surfaces extending longitudinally from its corresponding lip toward said second end, and b) a plurality of washers, each of said plurality of washers having an interior opening to permit said each of said plurality of washers to slide longitudinally along said post, said interior opening having a cut that mates with one of said sliding surfaces to constrain a rotational movement of said each of said plurality of washers when said each of said plurality of washers slides along its corresponding sliding surface in a longitudinal direction relative to said post, said each of said plurality of washers being constrained in its longitudinal movement toward said first end by a supporting lip associated with a sliding surface that mates with its interior opening cut, at least one said plurality of washers being configured to slide freely past a supporting lip associated with another one of said plurality of washers in its longitudinal direction toward said second end, wherein each of said plurality of confinement rings has a hole disposed through said each of said plurality of confinement rings to accommodate said post and to allow said each of said plurality of confinement rings to slide longitudinally along said post, holes disposed in said plurality of confinement rings to accommodate said post are substantially identical in shape and size.

13. The confinement ring assembly of claim 12 wherein each of said plurality of washers has a D-shape interior opening with a flat cut of said D-shape interior opening being configured to mate with one of said plurality of sliding surfaces.

14. The confinement ring assembly of claim 13 wherein each of said plurality of D-washers is configured to rest on its corresponding supporting lip to support a different one of said plurality of confinement rings when said plurality of confinement rings are in a stowed position.

15. The confinement ring assembly of claim 14 wherein said plurality of confinement rings are configured to be disposed closer to one another in a deployed position than in said stowed position, adjacent ones of said plurality of confinement rings being separated from one another by one of said plurality of washers in said deployed position, said deployed position representing a situation wherein said plurality of confinement rings are in place to facilitate processing of a substrate in said plasma processing chamber.

16. The confinement ring assembly of claim 15 wherein said plurality of confinement rings are stowed by moving a first confinement ring of said plurality of confinement rings in a first direction, said first direction being parallel to a direction from said first end to said second end of said post when said confinement ring support assembly is installed in said plasma processing chamber, said first confinement ring representing a confinement ring positioned closest to said second end of said post.

17. The confinement ring assembly of claim 16 wherein said plurality of confinement rings are deployed by moving said first confinement ring of said plurality of confinement rings in a second direction, said second direction being parallel to a direction from said second end to said first end of said post when said confinement ring support assembly is installed in said plasma processing chamber, said plurality of confinement rings being pushed closer to one another in said deployed position relative to said stowed position due to an arrest in movement of a second confinement ring of said plurality of confinement rings by another structure, said second confinement ring representing a confinement ring positioned closest to said first end of said post, said arrest in movement of said second confinement ring preventing said second confinement ring from moving in said second direction a lower electrode even as other plurality of confinement rings of said plurality of confinement rings continue to move in said second direction.

18. The confinement ring assembly of claim 17 wherein said second end of said post is fixedly attach to said first confinement ring.

19. A plasma processing system having a plasma processing chamber, comprising:

a plurality of confinement rings disposed within said plasma processing chamber; and a confinement ring support assembly also disposed within said plasma processing chamber for coupling together said plurality of confinement rings, said confinement ring support assembly including a) a post having a first end and a second end, said post having a plurality of supporting lips and a plurality of corresponding sliding surfaces, each of said plurality of supporting lips being offset from one another longitudinally and being disposed at a different arc relative to one another, each of said plurality of supporting lips being associated with a corresponding one of said plurality of sliding surfaces, said each of said plurality of sliding surfaces extending longitudinally from its corresponding lip toward said second end, and b) a plurality of washers, each of said plurality of washers having an interior opening to permit said each of said plurality of washers to slide longitudinally along said post, said interior opening having a cut that mates with one of said sliding surfaces to constrain a rotational movement of said each of said plurality of washers when said each of said plurality of washers slides along its corresponding sliding surface in a longitudinal direction relative to said post, said each of said plurality of washers being constrained in its longitudinal movement toward said first end by a supporting lip associated with a sliding surface that mates with its interior opening cut, at least one said plurality of washers being configured to slide freely past a supporting lip associated with another one of said plurality of washers in its longitudinal direction toward said second end, wherein each of said plurality of confinement rings has a hole disposed through said each of said plurality of confinement rings to accommodate said post and to allow said each of said plurality of confinement rings to slide longitudinally along said post, holes disposed in said plurality of confinement rings to accommodate said post are substantially identical in shape and size.

20. The plasma processing system of claim 19 wherein each of said plurality of washers has a D-shape interior opening with a flat cut of said D-shape interior opening being configured to mate with one of said plurality of sliding surfaces.

21. The plasma processing system of claim 20 wherein each of said plurality of D-washers is configured to rest on its corresponding supporting lip to support a different one of said plurality of confinement rings when said plurality of confinement rings are in a stowed position.

22. The plasma processing system of claim 21 wherein said plurality of confinement rings are configured to be disposed closer to one another in a deployed position than in said stowed position, adjacent ones of said plurality of confinement rings being separated from one another by one of said plurality of washers in said deployed position, said deployed position representing a situation wherein said plurality of confinement rings are in place to facilitate processing of a substrate in said plasma processing chamber.

23. The plasma processing system of claim 22 wherein said plurality of confinement rings are stowed by moving a first confinement ring of said plurality of confinement rings in a first direction, said first direction being parallel to a direction from said first end to said second end of said post when said confinement ring support assembly is installed in said plasma processing chamber, said first confinement ring representing a confinement ring positioned closest to said second end of said post.

24. The plasma processing system of claim 23 wherein said plurality of confinement rings are deployed by moving said first confinement ring of said plurality of confinement rings in a second direction, said second direction being parallel to a direction from said second end to said first end of said post when said confinement ring support assembly is installed in said plasma processing chamber, said plurality of confinement rings being pushed closer to one another in said deployed position relative to said stowed position due to an arrest in movement of a second confinement ring of said plurality of confinement rings by another structure, said second confinement ring representing a confinement ring positioned closest to said first end of said post, said arrest in movement of said second confinement ring preventing said second confinement ring from moving in said second direction a lower electrode even as other plurality of confinement rings of said plurality of confinement rings continue to move in said second direction.

25. The plasma processing system of claim 24 wherein said second end of said post is fixedly attach to said first confinement ring.

26. A confinement ring support assembly for coupling together a plurality of confinement rings, said confinement rings being configured for use in a plasma processing chamber, comprising:
   a post having first end and a second end, said post further having a first lip and a second lip, said first lip being disposed at a first position on said post, said second lip being disposed at a second position at a different arc relative to said first location on said post, said second position being disposed between said first position and said first end along a longitudinal axis of said post;
   a first washer configured to move slidably from said first lip past said second lip toward said first end of said post, said first washer having a first cut formed in its interior opening, said first cut being configured to engage with said first lip to prevent said first washer from sliding past said first lip in a direction away from said first end; and a second washer configured to move slidably from said second lip toward said first end of said post, said second washer having a second cut formed in its interior opening, said second cut being configured to engage with said second lip to prevent said second washer from sliding past said second lip in said direction away from said first end.

27. The confinement ring support assembly of claim 26 wherein said post further includes a first sliding surface extending from said first lip toward said first end of said post, said first cut being configured to mate with said first sliding surface when said first washer slides along said longitudinal axis toward said first end of said post to constrain an angular movement of said first washer.

28. The confinement ring support assembly of claim 27 wherein said post further includes a second sliding surface extending from said second lip toward said first end of said post, said second sliding surface being disposed at a different arc relative to said first sliding surface, said second cut being configured to mate with said second sliding surface when said second washer slides along said longitudinal axis toward said first end of said post to constrain an angular movement of said second washer.

29. The confinement ring support assembly of claim 26 wherein said post is configured to be disposed through at least two confinement rings of said plurality of confinement rings, said at least two confinement rings including a first confinement ring and a second confinement ring, said post being configured to be disposed through a first through hole in said first confinement ring and a second through hole in said second confinement ring, said first through hole and said second through hole being substantially similar in shape and size.

* * * * *